(12) United States Patent
Kuo

(10) Patent No.: US 8,714,670 B2
(45) Date of Patent: May 6, 2014

(54) MOUNTING APPARATUS WITH SLIDE STRUCTURE

(75) Inventor: Szu-Wei Kuo, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 165 days.

(21) Appl. No.: 13/316,462

(22) Filed: Dec. 10, 2011

(65) Prior Publication Data

US 2013/0126455 A1 May 23, 2013

(30) Foreign Application Priority Data

Nov. 23, 2011 (TW) .............................. 100143023 A

(51) Int. Cl.
*A47B 95/00* (2006.01)
*A47B 81/00* (2006.01)
*A47B 97/00* (2006.01)

(52) U.S. Cl.
USPC ........................................ 312/331; 312/223.1

(58) Field of Classification Search
USPC ............. 312/331, 334.4, 334.5, 265.1, 265.2, 312/265.3, 265.4, 223.1, 223.2
See application file for complete search history.

(56) References Cited

U.S. PATENT DOCUMENTS

| | | | | |
|---|---|---|---|---|
| 1,902,795 A * | 3/1933 | Wolters | ......................... | 312/331 |
| 2,174,181 A * | 9/1939 | Rand | .............................. | 312/331 |
| 2,214,291 A * | 9/1940 | Wyckoff | ....................... | 312/331 |
| 2,857,231 A * | 10/1958 | Mueller | ........................ | 312/304 |
| 2,894,670 A * | 7/1959 | Anderson et al. | ............. | 182/202 |
| 3,056,641 A * | 10/1962 | Parmet | ..................... | 312/334.37 |
| 3,093,429 A * | 6/1963 | Christen et al. | ............... | 312/331 |
| 3,367,732 A * | 2/1968 | Beye | .......................... | 312/332.1 |
| 3,589,205 A * | 6/1971 | Radovic | ........................ | 74/422 |
| 4,331,369 A * | 5/1982 | Lazar et al. | ..................... | 384/23 |
| 4,600,254 A * | 7/1986 | Whalen | ......................... | 312/323 |
| 5,253,743 A * | 10/1993 | Haas et al. | ................. | 198/347.1 |
| 5,273,133 A * | 12/1993 | Thocher et al. | .............. | 182/202 |
| 5,721,669 A * | 2/1998 | Becker et al. | ............. | 361/679.31 |
| 6,039,421 A * | 3/2000 | Fulterer | ....................... | 312/333 |
| 6,848,759 B2 * | 2/2005 | Doornbos et al. | ......... | 312/319.1 |
| 6,994,410 B2 * | 2/2006 | Hogan | ......................... | 312/322 |
| 7,171,099 B2 * | 1/2007 | Barnes et al. | ................ | 385/135 |
| 7,876,993 B2 * | 1/2011 | Krampotich et al. | ......... | 385/135 |
| 8,060,983 B2 * | 11/2011 | Bortoluzzi | ....................... | 16/85 |
| 8,272,104 B2 * | 9/2012 | Chen et al. | .................... | 16/354 |
| 8,283,610 B2 * | 10/2012 | Hirano | ........................ | 219/520 |
| 8,347,461 B2 * | 1/2013 | Chen et al. | ..................... | 16/354 |
| 8,452,149 B2 * | 5/2013 | Krampotich et al. | ......... | 385/135 |
| 2003/0189395 A1 * | 10/2003 | Doornbos et al. | ......... | 312/334.1 |
| 2009/0274430 A1 * | 11/2009 | Krampotich et al. | ......... | 385/135 |
| 2010/0071154 A1 * | 3/2010 | Bortoluzzi | ....................... | 16/85 |
| 2010/0176699 A1 * | 7/2010 | Biba et al. | .................. | 312/319.1 |
| 2010/0199965 A1 * | 8/2010 | Yoshidome | ................... | 126/190 |
| 2011/0050065 A1 * | 3/2011 | Lee et al. | ..................... | 312/402 |
| 2011/0206336 A1 * | 8/2011 | Krampotich et al. | ......... | 385/135 |
| 2013/0129266 A1 * | 5/2013 | Chen | ............................. | 384/20 |

\* cited by examiner

*Primary Examiner* — Darnell Jayne
*Assistant Examiner* — Kimberley S Wright
(74) *Attorney, Agent, or Firm* — Altis Law Group, Inc.

(57) ABSTRACT

A mounting apparatus is used for slidably mount a chassis of an electronic device to a shelf. The mounting apparatus includes two spaced gears pivotably attached to the chassis and a slide rail fixed to the shelf. The slide rail includes a rack to mesh with the gears.

11 Claims, 3 Drawing Sheets

MOUNTING APPARATUS WITH SLIDE STRUCTURE

BACKGROUND

1. Technical Field

The present disclosure relates to mounting apparatuses and, more particularly, to an apparatus for slidably mounting an electronic device to a shelf.

2. Description of Related Art

Electronic devices, such as servers, usually use mounting apparatus to be slidably attached to racks. However, the mounting apparatus ordinarily has less positioning structures, which is unstable during drawing or pushing the servers out of or into the racks.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
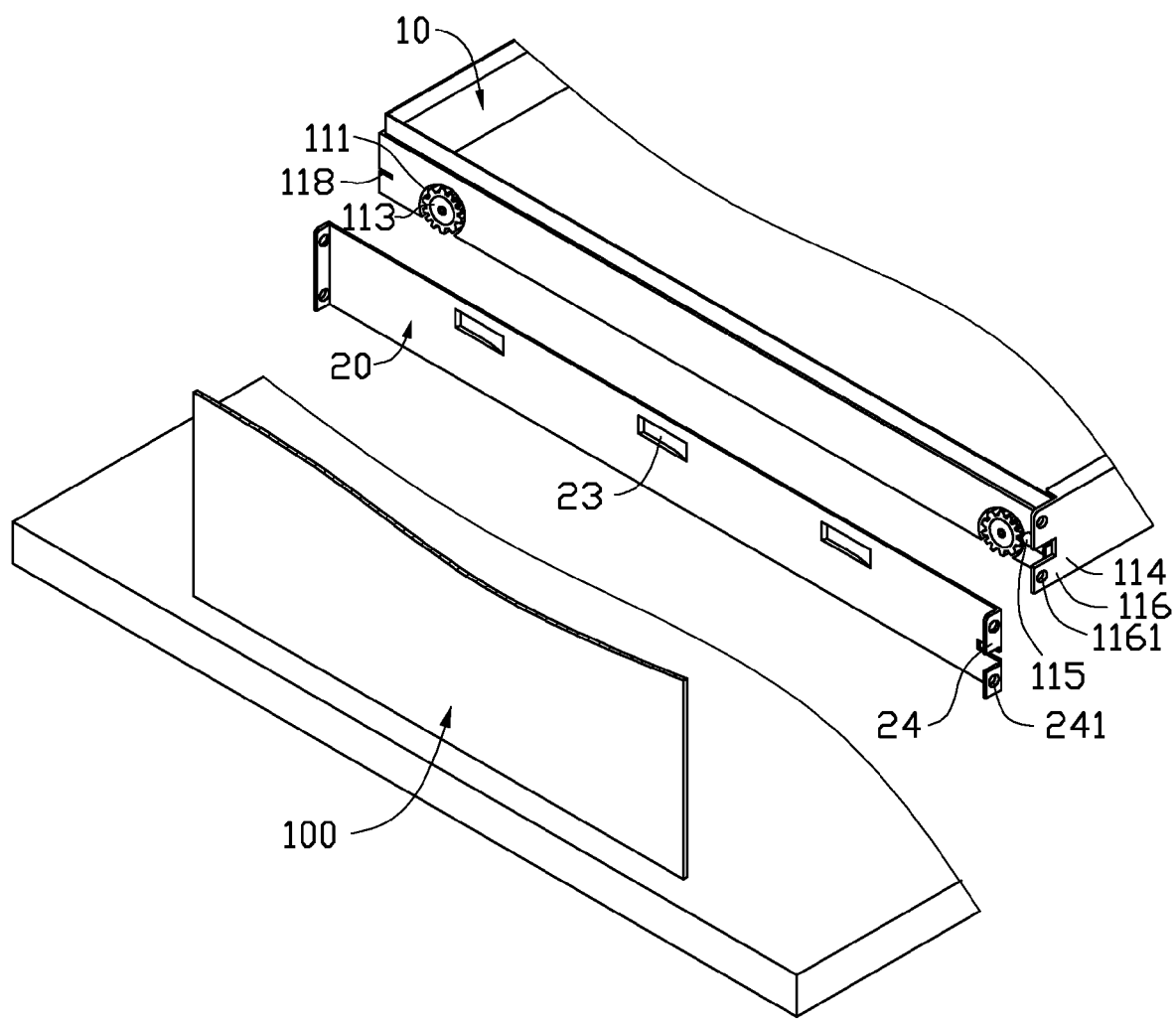
FIG. 1 is an exploded, isometric view of a mounting apparatus in accordance with an embodiment.
Figure 2:
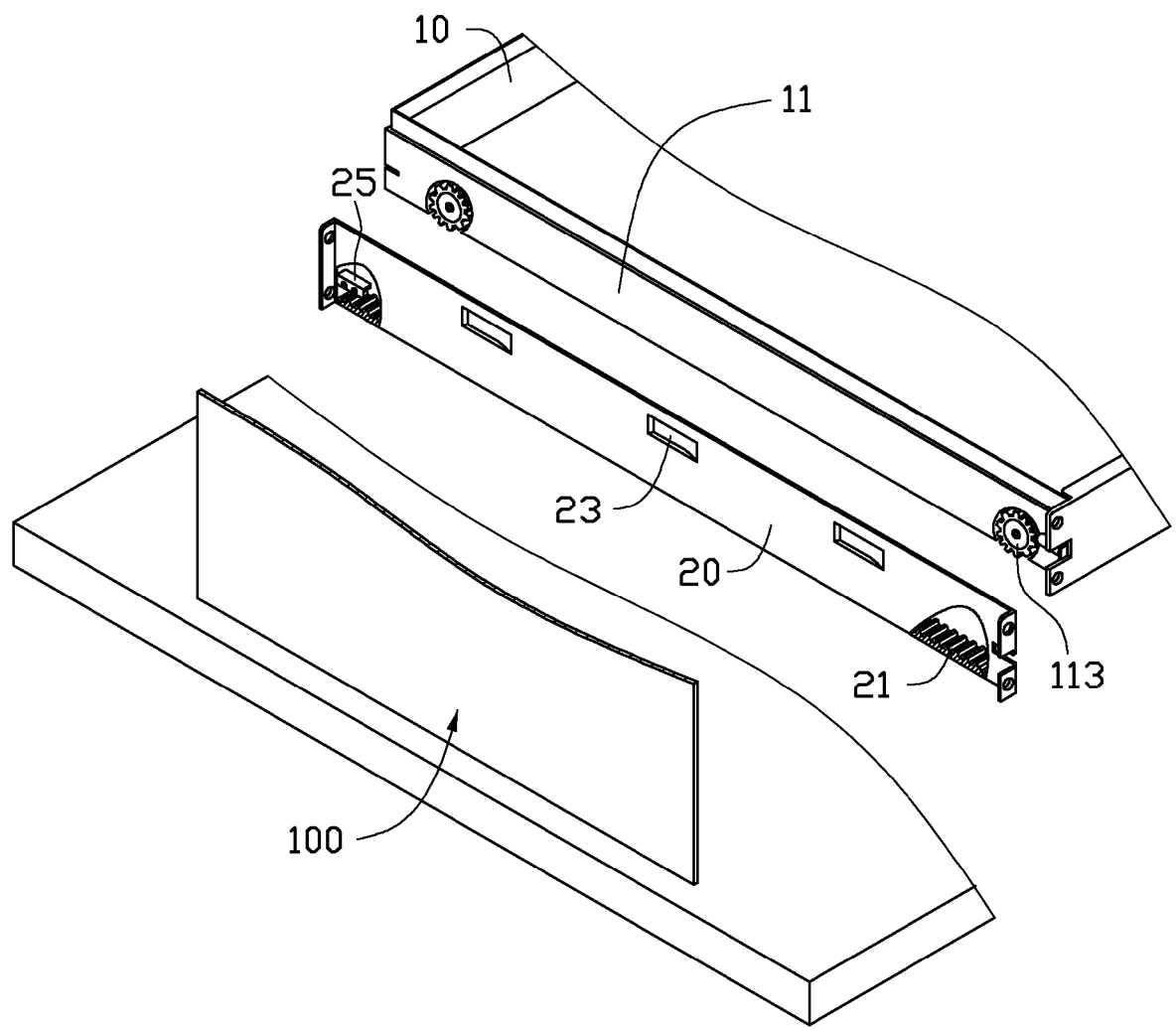
FIG. 2 is similar to FIG. 1, but partially cutaway.

Referring to FIGS. 1 and 2, an exemplary embodiment of a mounting apparatus used to slidably attach an electronic device to a shelf 100 includes a sliding unit arranged on a side surface of a chassis 10 of the electronic device, and a slide rail 20 fixed to an inner surface of the shelf 100. In this embodiment, the electronic device is a server.

The sliding unit includes a mounting plate 11 fixed to the side surface of the chassis 10, a fixing plate 114 fixed to a front end surface of the chassis 10, and two gears 113 pivotably attached to the mounting plate 11. The mounting plate 11 defines two spaced round receiving portions 111 in a lower portion and extending through the bottom of the mounting plate 11. Each gear 113 is pivotably received in a corresponding receiving portion 111. A positioning structure 115 is arranged on the fixing plate 114 and faces one of the gears 113. Two fixing pieces 116 are formed from an end of the fixing plate 114 adjacent to the mounting plate 11. Each fixing piece 116 defines a fixing hole 1161. A locking slot 118 is defined in a back end of the mounting plate 11.

The slide rail 20 includes a rack 21 perpendicularly formed on an inner side surface of the slide rail 20 facing the chassis 10. A plurality of resilient raised portions 23 protrudes from the inner side surface of the slide rail 20. Two tabs 24 extend from a front end of the slide rail 20. Each tab 24 defines a mounting hole 241. A locking block 25 is formed from a back end of the rack 21.

Figure 3:
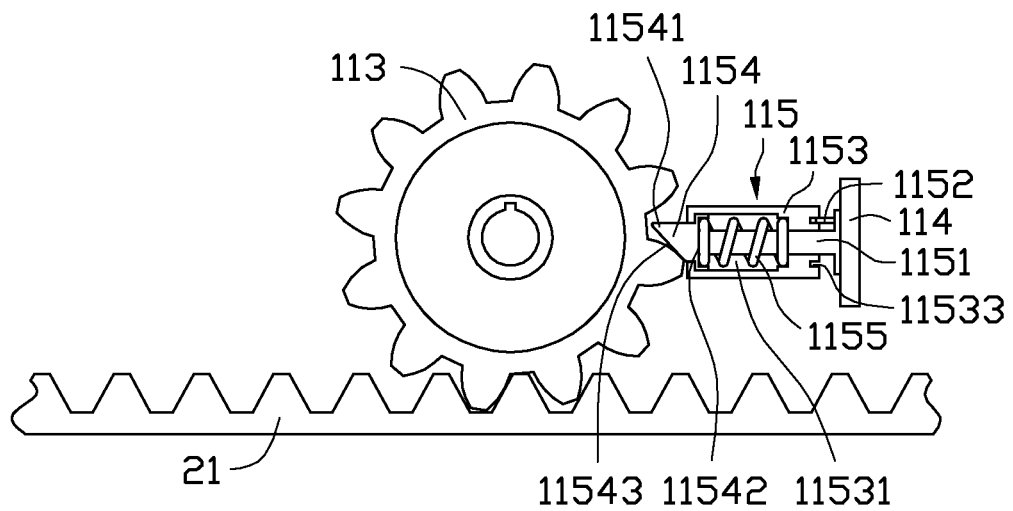
FIG. 3 is an assembled, plan view of a part of FIG. 1.

Referring to FIG. 3, the positioning structure 115 includes a shaft 1151 extending rearward from the fixing plate 114, a receiving member 1153 set around the shaft 1151. A stop member 1154 set around the shaft 1151 and movably received in the receiving member 1153, and a resilient member 1155 set around the shaft 1151 and received in the receiving member 1153 to push the stop member 1154 toward the gear 113. The receiving member 1153 defines a receiving space 11531. The stop member 1154 includes a wedge portion 11541 formed on a first end of the stop member 1154 and extending out of the receiving space 11531, and a stepped portion 11542 formed at a second end of the stop member 1154 and slidably, nonrotatably received in the receiving space 11531. The wedge portion 11541 includes a slope surface 11543. The resilient member 1155 abuts against the stepped portion 11542 and the receiving member 1153. Two opposite positioning holes 11533 are defined in an end of the receiving member 1153 facing the fixing plate 114. A pin 1152 extends from the fixing plate 114, parallel to the shaft 1151. The pin 1152 can selectively engage in one of the positioning holes 11533 for positioning the receiving member 1153.

When the chassis 10 needs to be pushed into the shelf 100, the stop member 1154 is positioned to make the slope surface 11543 face downward. The chassis 10 is pushed rearward to make the gears 113 mesh with the rack 21. The gears 113 rotate. A gear tooth of the gear 113 near the positioning structure 115 pushes the slope surface 11543 to move the stop member 1154 against the resilient member 1155, until the gear tooth rides over the stop member 1154. Therefore, the chassis 10 moves into the shelf 100 along the rack 21, until the locking block 25 engages in the locking slot 118. While the chassis 10 is moving into the shelf 100, the gear tooth riding over the stop member 1154 is stopped by the wedge portion 11541 to prevent the gears 113 from rotating in reverse relative to the rack 21. The resilient raised portions 23 abut against the mounting plate 11.

When the chassis 10 needs to be pulled out of the shelf 100, the receiving member 1153 is moved away from the fixing plate 114 to release the pin 1152 from the positioning hole 11533. The receiving member 1153 together with the stop member 1154 is then rotated 180 degrees around the shaft 1151 to make the pin 1152 engage in the other positioning hole 11533. The slope surface 11543 faces upward. The chassis 10 is pulled to make the gears 113 mesh with the rack 21, thereby moving out of the shelf 100 along the rack 21.

For further stability, when the chassis 10 entirely slides into the shelf 100, a screw (not shown) extends through each fixing hole 1161 to screw in the corresponding mounting hole 241.

In the embodiment, the gears 113 mesh with the rack 21 to stably slide the chassis 10 relative to the shelf 100. The positioning structure 115 limits the gears 113 and makes the gears 113 rotate along a designed direction.

It is believed that the present embodiments and theirs advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A mounting apparatus for slidably mounting a chassis to a shelf, comprising:

two gears to be pivotably attached to one side surface of the chassis;

a positioning structure arranged on the chassis aligning one of the gears, wherein the positioning structure comprises a shaft fixed to the chassis, a receiving member set around the shaft, a stop member set around the shaft and slidably, nonrotatably received in the receiving member, and a resilient member set around the shaft and received in the receiving member to bias the stop member toward the one of the gears, the stop member engages with a gear tooth of the one of the gears; wherein a mounting plate is fixed to the side surface of the chassis, a fixing plate is fixed to a front end surface of the chassis, the gears are pivotably attached to the mounting plate;

wherein the positioning structure is arranged on the fixing plate and faces one of the gears, the shaft extends rearward from the fixing plate and a slide rail to be fixed on an inner side surface of the shelf, the slide rail comprising a rack meshing with the gears.

2. The mounting apparatus of claim 1, wherein the mounting plate defines two spaced round receiving portions in a lower portion and extending through the bottom of the mounting plate, each of the gears is pivotably received in a corresponding receiving portion.

3. The mounting apparatus of claim 1, wherein the receiving member defines a receiving space, the stop member comprises a wedge portion formed at a first end of the stop member and extending out of the receiving space, and a stepped portion formed at a second end of the stop member and slidably received in the receiving space, the resilient member abuts against the stepped portion and the receiving member, the wedge portion comprises a slope surface engageable with the gear tooth of the one of the gears.

4. The mounting apparatus of claim 3, wherein two opposite positioning holes are defined in an end of the receiving member and face to the fixing plate, a pin extends from the fixing plate and parallel to the shaft, to selectively engage in one of the positioning holes for positioning the receiving member.

5. The mounting apparatus of claim 1, wherein a plurality of resilient raised portions protrudes from the inner side surface of the slide rail to abut against the mounting plate.

6. The mounting apparatus of claim 1, wherein a locking slot is defined in a back end of the mounting plate, a locking block is formed from a back end of the rack to engage in the locking slot.

7. An assembly comprising:
a shelf comprising a slide rail, the slide rail comprising a rack;
a chassis;
a mounting plate fixed to one side surface of the chassis;
a positioning structure arranged on the mounting plate aligning one of the gears, wherein the positioning structure comprises a shaft fixed to the mounting plate, a receiving member set around the shaft, a stop member set around the shaft and slidably, nonrotatably received in the receiving member, and a resilient member set around the shaft and received in the receiving member to bias the stop member toward the one of the gears, the stop member engages with a gear tooth of the one of the gears; wherein the mounting plate defines two spaced round receiving portions in a lower portion and extending through the bottom of the chassis, each of the gears is pivotably received in a corresponding receiving portion;

wherein a fixing plate is fixed to a front end surface of the mounting plate, the positioning structure is arranged on the fixing plate and faces the one of the gears, the shaft extends rearward from the fixing plate and two gears pivotably attached to the mounting plate and mesh with the rack.

8. The assembly of claim 7, wherein the receiving member defines a receiving space, the stop member comprises a wedge portion formed at a first end of the stop member and extending out of the receiving space, and a stepped portion formed at a second end of the stop member and slidably received in the receiving space, the resilient member abuts against the stepped portion and the receiving member, the wedge portion comprises a slope surface engageable with the gear tooth of the one of the gears.

9. The assembly of claim 8, wherein two opposite positioning holes are defined in an end of the receiving member and face the fixing plate, a pin extends from the fixing plate and parallel to the shaft, to selectively engage in one of the positioning holes for positioning the receiving member.

10. The assembly of claim 7, wherein a plurality of resilient raised portions protrudes from the inner side surface of the slide rail to abut against the mounting plate.

11. The assembly of claim 7, wherein a locking slot is defined in a back end of the mounting plate, a locking block is formed from a back end of the rack to engage in the locking slot.

* * * * *